United States Patent [19]
Ishii

[11] Patent Number: 5,461,645
[45] Date of Patent: Oct. 24, 1995

[54] FREQUENCY STABILIZING DEVICE

[75] Inventor: Junichi Ishii, Tokyo, Japan

[73] Assignee: NEC Corporation, Tokyo, Japan

[21] Appl. No.: 245,647

[22] Filed: May 18, 1994

[30] Foreign Application Priority Data

May 18, 1993 [JP] Japan ................................. 5-115089

[51] Int. Cl.$^6$ ........................... H04L 27/06; H04B 1/26
[52] U.S. Cl. ................... 375/344; 455/196.1; 455/197.1
[58] Field of Search ................................... 375/52–54, 57, 375/178, 80, 83, 81, 86, 97; 329/304, 306, 346; 455/196.1, 197.1, 265

[56] References Cited

U.S. PATENT DOCUMENTS

| | | | |
|---|---|---|---|
| 4,947,409 | 8/1990 | Raith et al. ............................ | 375/97 |
| 5,065,107 | 11/1991 | Kumar et al. ......................... | 375/97 |
| 5,289,506 | 2/1994 | Kitayama et al. .................... | 375/97 |

FOREIGN PATENT DOCUMENTS

| | | |
|---|---|---|
| 63-256021 | 10/1988 | Japan . |
| 62-256010 | 10/1988 | Japan . |

Primary Examiner—Stephen Chin
Assistant Examiner—Huong Luu
Attorney, Agent, or Firm—Sughrue, Mion, Zinn, Macpeak & Seas

[57] ABSTRACT

An intermediate frequency (IF) converter converts a received signal to an IF signal. A demodulator demodulates the IF signal to a demodulated signal and detects a phase error. A frequency error detector detects a frequency error based on the phase error. A modulated-carrier detector detects a modulated carrier component from the IF signal. When the modulated carrier component is detected, a controller achieves a frequency stabilizing operation based on the frequency error.

18 Claims, 4 Drawing Sheets

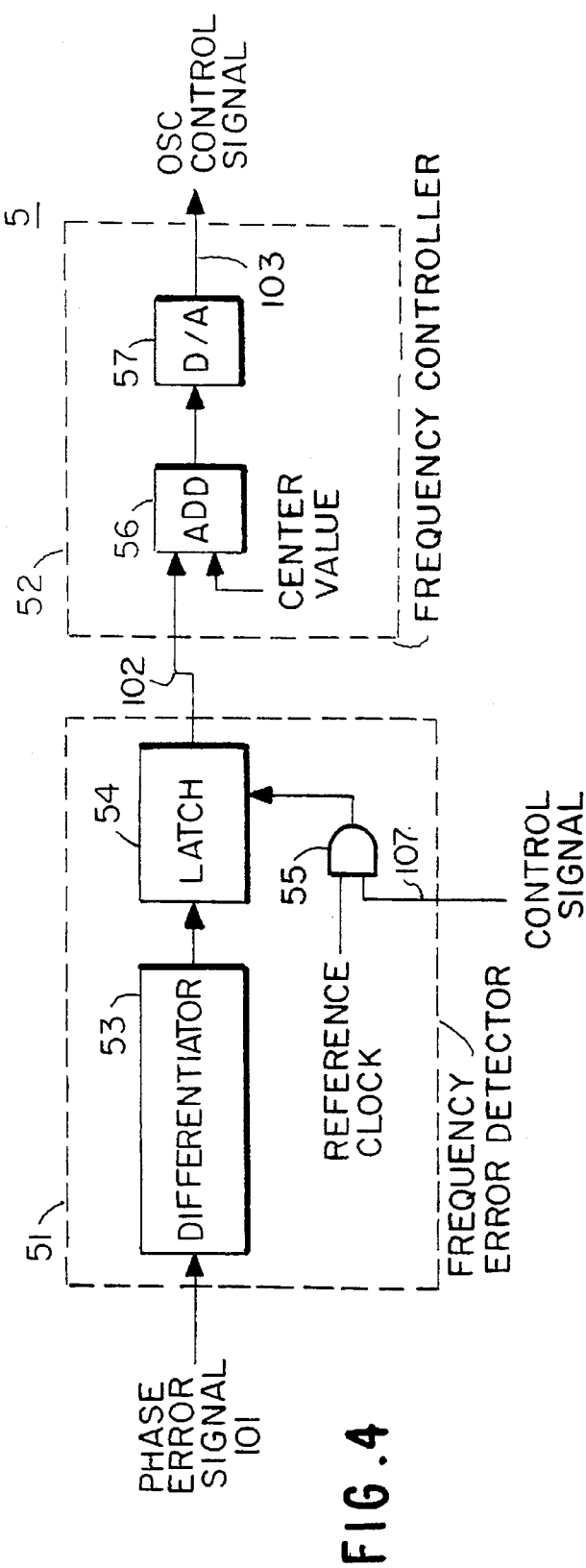
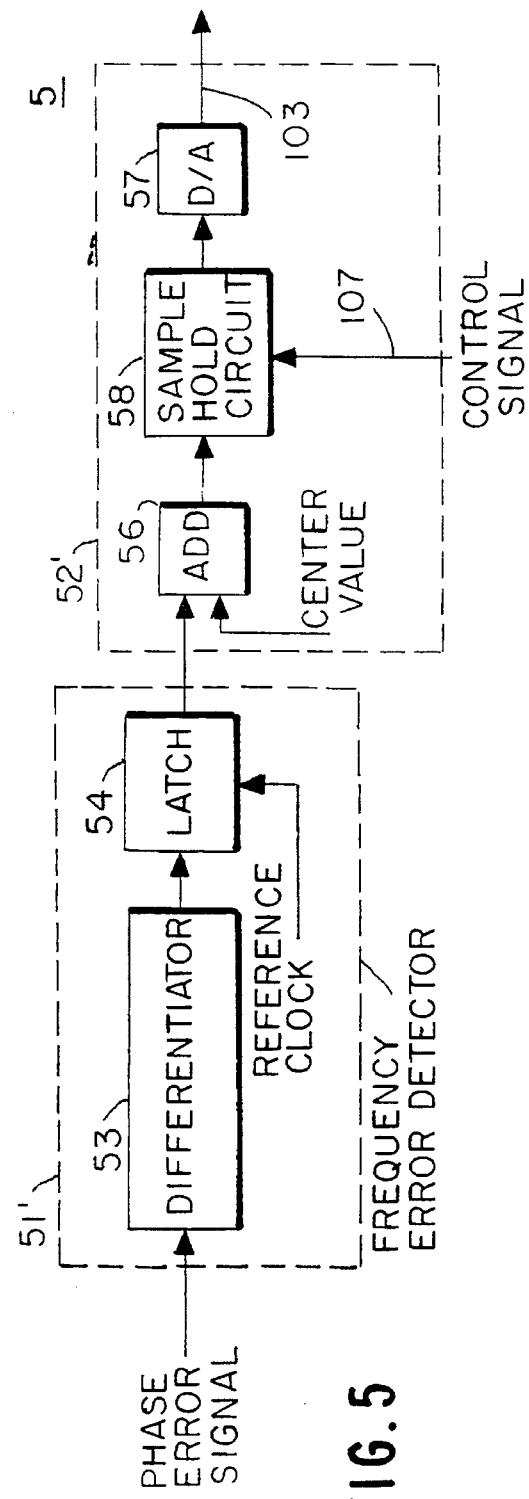
FIG. 4
FIG. 5

FREQUENCY STABILIZING DEVICE

BACKGROUND OF THE INVENTION

1. Field of the Invention

The present invention relates to a frequency stabilizing device and, more particularly, to a carrier frequency stabilizing device in a digital mobile radio communication system.

2. Description of the Related Art

A conventional frequency stabilizing device is described in, for example, Japanese Patent Laid-Open No. 256010/1998 (JP-A-63256010). This frequency stabilizing device detects a received field strength of a received signal and controls an oscillation control signal to an oscillator in response to frequency error information when the received field strength surpasses a predetermined threshold. This technique results in very effective frequency stabilizing operation.

Another frequency stabilization device is described in, for example, Japanese Patent Laid-Open No. 256021/1988 (JP-A-63256021). This frequency stabilizing device improved the frequency stabilizing operation under Rayleigh fading by constructing two receiving portions and by achieving the frequency stabilizing operation based on a higher received field strength.

However, these frequency stabilizing devices do not achieve an accurate frequency stabilizing operation because accurate frequency error information is not obtained from a demodulated signal when the received field strength of the received signal is high but a modulated carrier does not exist. this condition may occur when, for example, there is interference from an adjacent channel.

Moreover, since the latter device needs the two receiving portions, the circuit is necessarily large.

SUMMARY OF THE INVENTION

It is therefore an object of the present invention to provide a frequency stabilizing device capable of achieving highly stable operation even when there is no modulated carrier.

It is another object of the present invention to provide a frequency stabilizing device capable of reducing circuit size.

According to the present invention, the inventive frequency stabilizing device includes a frequency converter for converting a frequency of a received signal to an intermediate frequency by mixing with a local frequency signal, a frequency detector for detecting a frequency error indicating the difference between the intermediate signal and a predetermined standard signal, a controller for controlling a frequency of said local frequency signal based on the frequency error, a modulated-carrier detector for detecting a modulated-carrier component of the intermediate frequency signal, and a control signal generator for generating a control signal to said controller in response to the detected modulated-carrier component.

BRIEF DESCRIPTION OF THE DRAWINGS

The above and other objects, features and advantages of this invention will become more apparent from the following detailed description taken with the accompanying drawings in which:

FIG. 4 is a block diagram of a preferred embodiment of the controller shown in FIG. 1;

FIG. 5 is a block diagram of another preferred embodiment of the controller shown in FIG. 1.

In the drawings, the same reference numerals denote the same structural elements.

DESCRIPTION OF THE PREFERRED EMBODIMENTS

Now there will be described in detail a preferred embodiment of the present invention with reference to FIGS. 1 to 5.

Figure 1:
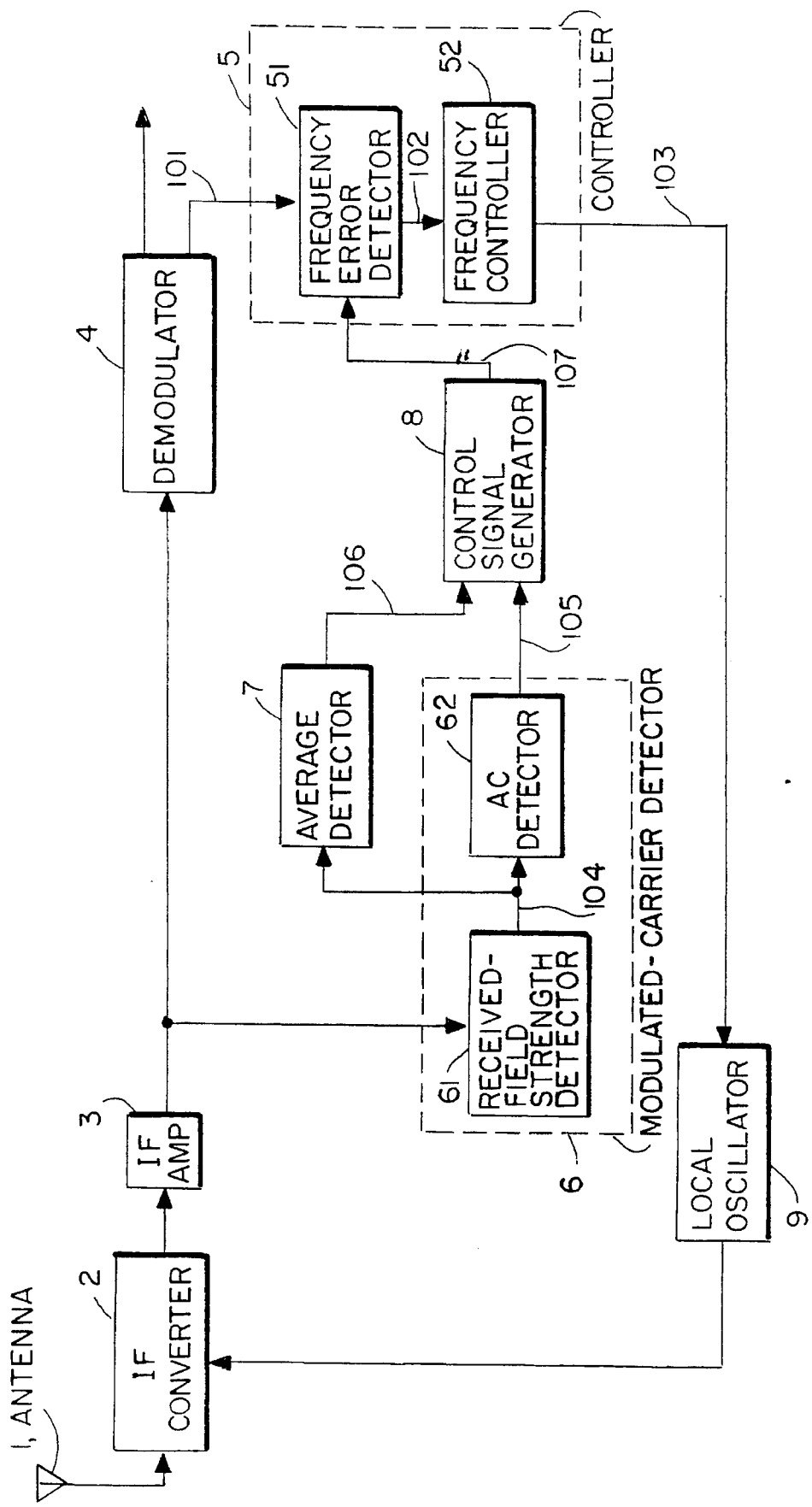
FIG. 1 is a block diagram of a preferred embodiment of a frequency stabilizing device of the present invention.

FIG. 1 shows a frequency stabilizing device of a preferred embodiment of the present invention. In FIG. 1, the frequency stabilizing device consists of an antenna 1, an intermediate frequency (IF) converter 2, an IF amplifier 3, a demodulator 4, a controller 5, a modulated-carrier detector 6, a received field strength average detector 7, a control signal generator 8 and a local oscillator 9. The controller 5 consists of a frequency error detector 51 and a frequency controller 52. The modulated-carrier detector 6 consists of a received field strength detector 61 and an AC detector 62.

The IF converter 2 converts a received signal, such as a π/4 QPSK signal, from the antenna 1 to an IF signal. The demodulator 4 demodulates an amplified IF signal from the IF amplifier 3 and outputs a demodulated signal and a phase error signal 101 indicating a phase difference between a carrier of the received signal and a predetermined standard signal, e.g., a carrier of a local frequency. The controller 5 detects a frequency error signal 102 from the phase error signal 101 produced by the frequency error detector 51 and generates an oscillation (osc) control signal 103 based on the frequency error signal 102 by the frequency controller 52.

The frequency local oscillator 9 is controlled by the osc control signal 103. The output from the local oscillator is supplied as the local frequency to the IF converter 2.

The modulated-carrier detector 6, the average detector 7 and the control signal generator 8 are circuits to judge whether or not the frequency stabilizing operation is done. The received field strength detector 61 in the modulated-carrier detector 6 detects a received field strength 104 of the amplified IF signal. The average detector 7 detects an average 106 of the received field strength 104 because the received field strength changes due to Rayleigh fading. The AC detector 62 detects a peak level 105 of the modulated-carrier from the received field strength 104.

The control signal generator 8 generates a control signal 107 to the controller 5 in response to the peak level 105 and the average 106 of the received field strength. Preferably, the control signal generator 8 controls the frequency of the local oscillator 9 based on the frequency error 102 when the average 106 of the received field strength is higher than a first predetermined threshold and the peak level 105 is higher than a second predetermined threshold.

Figure 2:
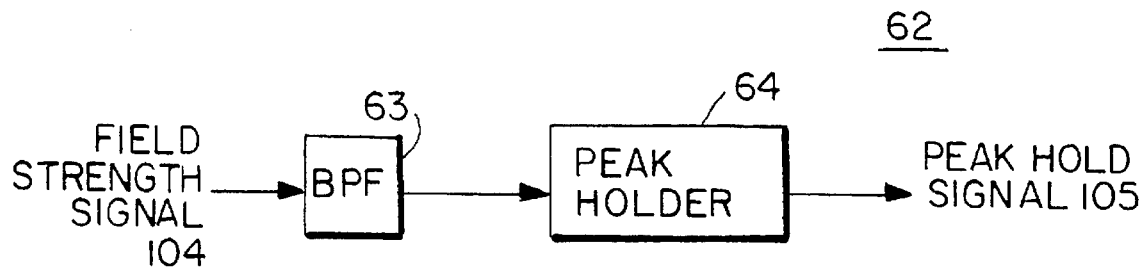
FIG. 2 is a block diagram of a preferred embodiment of the AC detector shown in FIG. 1.

FIG. 2 shows a preferred embodiment of the AC detector 62 in the modulated-carrier detector 6 shown in FIG. 1. In FIG. 2, the AC detector 62 consists of a band pass filter (BPF) 63 and a peak holder 64.

A center frequency of the BPF 63 is an inverse of symbol rate of the received signal. The symbol rate is equal to half of the data rate for transmission and is equal to a period of an amplitude variation in π/4 QPSK. Therefore, the BPF 63 detects the symbol rate component contained in the received field strength information 104 from the received field strength detector 61. The peak holder 64 holds a peak level of the symbol rate component.

Generally, in mobile radio communications, the received field varies accompanied by amplitude variations of the carrier corresponding to the modulation procedure and also by Rayleigh variation. The period of the Rayleigh variation is sufficiently shorter than the symbol rate used in the π/4 QPSK modulation procedure, and hence the symbol rate component only can be extracted from the received field level information by the BPF 63.

Figure 3:
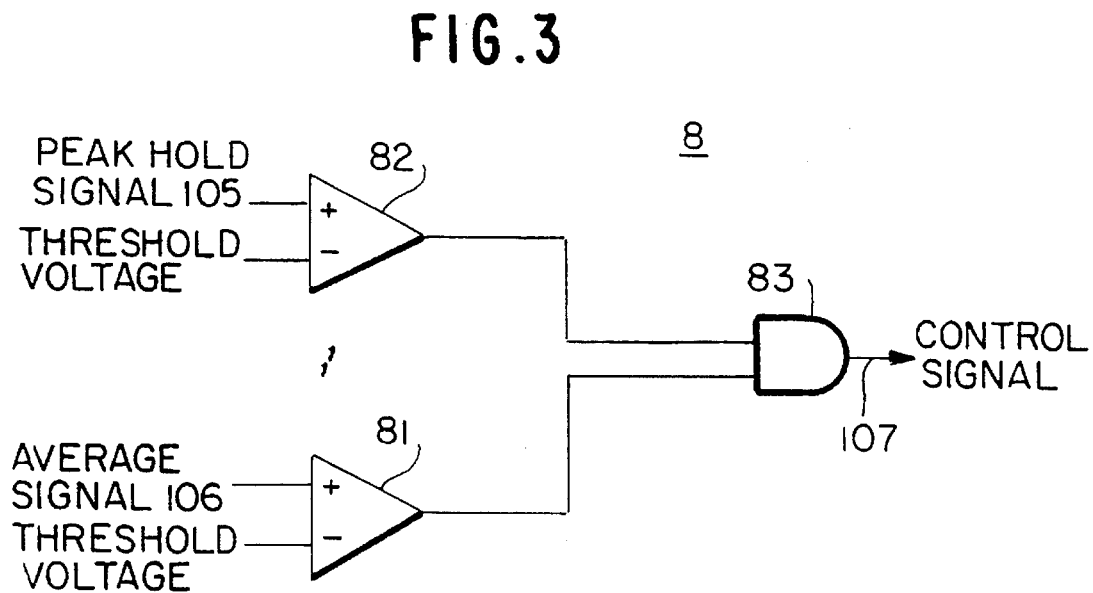
FIG. 3 is a block diagram of a preferred embodiment of the control signal generator shown in FIG. 1.

FIG. 3 shows a preferred embodiment of the control signal generator 8 shown in FIG. 1. In FIG. 3, the control signal generator 8 consists of comparators 81 and 82, and an AND gate 83.

The comparator 81 compares the average signal 106 from the average detector 7 with the first predetermined threshold level and supplies a high level signal to the AND gate 83 when the average signal is equal to or greater than the first threshold level or a low level signal to the AND gate 83 when the average signal is smaller than the first threshold. The comparator 82 compares the peak hold signal 105 of the AC detector 62 with the second predetermined threshold level and supplies a high level signal to the AND gate 83 when the peak level is equal to or greater than the second threshold level or a low level signal to the AND gate 83 when the peak level is smaller than the second threshold level.

The AND gate 83 is applied with both outputs of the comparators 81 and 82 and supplies the control signal 107 to the controller 5 so that the controller 5 achieves the frequency stabilizing operation when both signals 105 and 106 are equal to or higher than the first and second predetermined threshold, respectively.

FIG. 4 shows a preferred embodiment of the controller 5 shown in FIG. 1. In FIG. 4, the frequency error detector 51 in the controller 5 consists of a differentiator 53, a latch 54 and an AND gate 55 and the frequency controller 52 consists of an adder 56 and a digital-to-analog (D/A) converter 57.

The differentiator 53 differentiates the phase error signal 101 from the demodulator 4 and supplies the frequency error signal to the latch 54. A reference clock for sampling the frequency error signal and the control signal 107 are fed to the AND gate 55, the control signal 107 serving as an enable signal. The latch 54 latches the frequency error signal with latch pulses which are fed from the AND gate 55 and supplies a latched frequency error signal 102 to the ADD 56. While the control signal 107 is in the low level, no latch pulse is fed to the latch 54. As a result, the frequency error signal is held, so that the frequency error signal is maintained constant. On the other hand, when the control signal 107 goes high, latch pulses are fed to the latch 54 with the result that the latch 54 delivers the frequency error signal of the differentiator 53 directly without holding it.

The ADD 56 adds the latched frequency error signal 102 and a center value which is used for the local oscillator 9 to generate a predetermined frequency. The D/A converter 57 converts the output of the ADD 56 to an analog osc control signal 103.

FIG. 5 shows another embodiment of the controller 5 shown in FIG. 1. In FIG. 5, the difference between the controllers shown in FIGS. 4 and 5 is a sample hold circuit 58 to which the control signal 107 is fed. The latch 54 latches the frequency error signal of the differentiator 53 with the reference clock. The sample-hold circuit 58 includes a latch and an AND gate and the control signal 107 is fed to one input of the AND gate. The sample-hold circuit 58 holds a previous output of the ADD 56 when the control signal 107 is low. On the other hand, the sample-hold circuit 58 delivers the output of the ADD 56 directly when the control signal is high.

In this way, when the received field strength is equal to or higher than the first predetermined threshold and the modulated-carrier component is detected, the frequency stabilizing operation is achieved based on the frequency error. On the other hand, when either the received field strength is smaller than the first predetermined threshold or the modulated-carrier component is not detected, the frequency stabilizing operation is not achieved.

Figure 6:
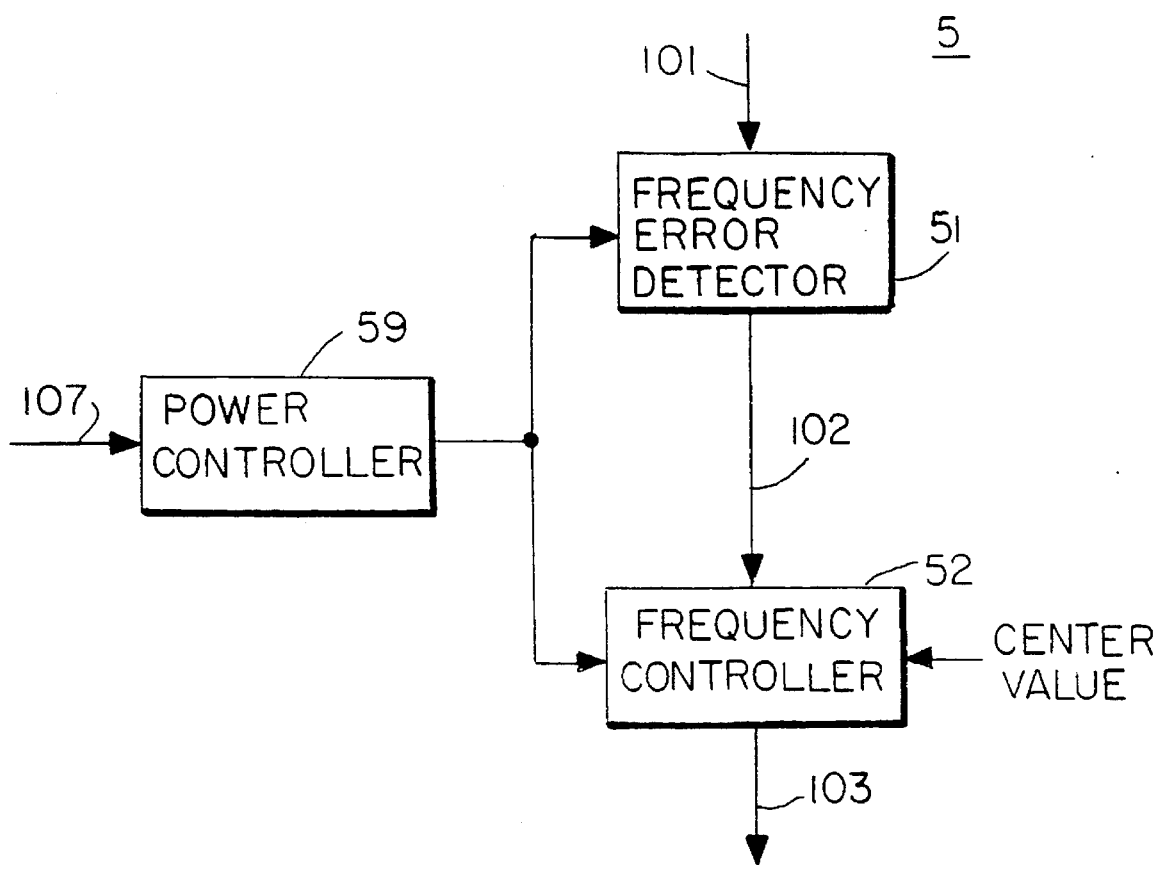
FIG. 6 is a block diagram of the other preferred embodiment of the controller shown in FIG. 1.

FIG. 6 shows the other embodiment of the controller 5 shown in FIG. 1. In FIG. 6, the controller 5 includes a power controller 59 in addition to the frequency error detector 51 and the frequency controller 52 shown in FIG. 1. The power controller 59 is supplied with the control signal 107 from the control signal generator 8 and controls the supply of power to the frequency error detector 51 and the frequency controller 52. When the control signal 107 is high, the power is supplied from the power controller 59 to the circuits of the frequency error detector 51 and the frequency controller 52. On the other hand, when the control signal 107 is low, the power is supplied to the circuits selectively. Namely, the power is supplied to the latch 54, the AND gate 55, the ADD 56 and the D/A converter 57 in FIG. 4. In FIG. 5, the power is supplied to the sample-hold circuit 58 and the D/A converter 57.

This power control achieves a battery saving when the frequency stabilizing operation is not done, i.e., when the received field strength is smaller than the predetermined threshold or the modulated-carrier is not detected. The power is supplied only when the frequency stabilizing operation is done, i.e., when the received field strength is equal to or higher than the predetermined threshold and the modulated-carrier is detected.

Although the embodiment has been described with respect to a case in which the modification was based on a specific factor, it goes without saying that the present invention is not restricted to this case.

Although the embodiment is explained in reference to a π/4 QPSK signal, other modulated signals may be used without departing from the spirit or scope of the invention.

As hitherto described, since the frequency stabilizing device detects the modulated-carrier component in addition to the received field strength of the received signal, and the controller, if the modulated-carrier is detected, updates the frequency control amount based on the frequency error information and if not detected, stops updating it to remain unchanged, the frequency stabilizing device can operate in a highly stable way.

Moreover, since the power is supplied when the frequency stabilizing operation is done, the battery saving is achieved.

What is claimed is:

1. A frequency stabilizing device comprising:

first detecting means for detecting a frequency error indicating the difference between an input signal and a predetermined signal;

control means for controlling an oscillation signal based on the frequency error;

second detecting means for detecting a modulated-carrier component of the input signal; and generating means for generating a control signal to said control means in response to the detected modulated-carrier component.

2. The frequency stabilizing device as claimed in claim 1, wherein said second detecting means comprises:

third detecting means for detecting a field strength of the input signal;

a band pass filter, whose center frequency is an inverse of a symbol rate of the inputting signal, for input said field strength and for supplying a symbol rate component; and means for holding a peak level of said symbol rate component and for supplying said peak level as said modulated-carrier component.

3. The frequency stabilizing device as claimed in claim 2, said frequency stabilizing device further comprising:

average detecting means for detecting an average of said field strength.

4. The frequency stabilizing device as claimed in claim 3, wherein said generating means comprises:

first comparing means for comparing said average with a first predetermined level;

second comparing means for comparing said peak level with a second predetermined level; and an AND gate for inputting both compared signals and for supplying said control signal to said control means so that a frequency stabilizing operation is executed when the modulated carrier component is detected and said average of the field strength is equal to or higher than the first predetermined level.

5. The frequency stability device as claimed in claim 1, said frequency stabilizing device further comprising:

converting means for converting a frequency of said input signal from a micro wave frequency to an intermediate frequency; and demodulating means for demodulating said intermediate frequency signal and detecting a phase error signal indicating a difference between a demodulated signal and said predetermined signal.

6. The frequency stabilizing device as claimed in claim 5, wherein said first detecting means comprises:

differentiating means for differentiating said phase error signal by a time and supplying said frequency error; and latch means for latching said frequency error with a latch pulse based on said control signal.

7. The frequency stability device as claimed in claim 6, wherein said control means comprises:

adding means for adding the latched frequency error and a predetermined value; and digital-to-analog converting means for converting the added signal to an analog signal in order to control said oscillation signal .

8. The frequency stability device as claimed in claim 5, wherein said control means comprises:

differentiating means for differentiating said phase error signal by a time and supplying said frequency error;

adding means for adding the said frequency error and a predetermined value;

sample holding means for latching said frequency error with a latch pulse based on said control signal; and digital-to-analog converting means for converting a sample hold signal at sample holding means an analog signal in order to control said oscillation signal.

9. The frequency stabilizing device as claimed in claim 1, said frequency stabilizing device further comprising:

power control means for controlling a power to said first detecting means and said control means based on said control signal.

10. The frequency stabilizing device as claimed in claim 1, wherein said input signal is modulated by $\pi/4$ quadrature phase shift keying.

11. A frequency stabilizing device comprising:

a frequency converter for converting a frequency of a received signal to an intermediate frequency by mixing a local frequency signal;

a frequency detector for detecting a frequency error indicating the difference between said intermediate signal and a predetermined signal;

a controller for controlling a frequency of said local frequency signal based on the frequency error;

a modulated-carrier detector for detecting a modulated-carrier component of the intermediate frequency signal; and a control signal generator for generating a control signal to said controller in response to the detected modulated-carrier component so that a frequency stabilizing operation is executed when the modulated carrier component is detected.

12. The frequency stabilizing device as claimed in claim 11, wherein said modulated-carrier detector comprises:

a received field strength detector for detecting a received field strength of said intermediate frequency signal; and an alternating current detector for detecting said modulated-carrier component from the field strength.

13. The frequency stabilizing device as claimed in claim 11, wherein said alternating current detector comprises:

a band pass filter, whose center frequency is an inverse of a symbol rate of said received signal, for inputting said field strength and for supplying a symbol rate component; and a peak holder for holding a peak level of said symbol rate component and for supplying said peak level as said modulated-carrier component.

14. The frequency stabilizing device as claimed in claim 11, said controller further comprising:

a power controller for controlling a power supply to said frequency detector and said controller according to said control signal so that a power is supplied to said frequency detector and controller when the frequency stabilizing operation is executed.

15. A method for controlling a frequency stabilizing device, the method comprising the steps of:

(a) detecting a frequency error indicating a difference between an input signal and a predetermined signal;

(b) detecting a modulated carrier component from said input signal;

(c) generating a control signal based on the detected modulated carrier component; and (d) controlling a frequency stabilizing operation based on the frequency error in response to the control signal.

16. The method for controlling said frequency stabilizing device as claimed in claim 15, wherein said step (b) comprises:

(e) detecting a received field strength from the input signal;

(f) detecting an alternating current component from the received field strength as the modulated carrier component.

17. A method for controlling a frequency stabilizing device, the method comprising the following steps of:
(a) converting a frequency of a received signal to an intermediate frequency by mixing with a local frequency signal;
(b) demodulating the intermediated frequency signal and detecting a phase error indicating a phase difference between the demodulated signal and a predetermined signal;
(c) detecting a frequency error based on the phase error;
(d) detecting a received field strength from said intermediate frequency signal;
(e) detecting an average of the received field strength;
(f) detecting a modulated carrier component from the received field strength;
(g) generating a control signal based on the detected modulated carrier component and the average of the received field strength; and
(h) controlling a frequency of the local frequency signal according to the frequency error in response to the control signal.

18. The method for controlling said frequency stabilizing device as claimed in claim 17, the method further comprising the following steps of:
(i) controlling a power supply whether or not the modulated carrier component is detected.

* * * * *